United States Patent
Sanchez (10) Patent No.: US 7,154,924 B2
(45) Date of Patent: Dec. 26, 2006

(54) METHOD FOR CONFIGURING A LASER OPERATING SYSTEM

(75) Inventor: Jorge Sanchez, Poway, CA (US)

(73) Assignee: Ceyx Technologies, Inc., San Diego, CA (US)

( * ) Notice: Subject to any disclaimer, the term of this patent is extended or adjusted under 35 U.S.C. 154(b) by 0 days.

(21) Appl. No.: 10/512,931

(22) PCT Filed: Jan. 13, 2003

(86) PCT No.: PCT/US03/00848

§ 371 (c)(1), (2), (4) Date: Oct. 29, 2004

(87) PCT Pub. No.: WO03/061081

PCT Pub. Date: Jul. 24, 2003

(65) Prior Publication Data

US 2005/0226291 A1    Oct. 13, 2005

Related U.S. Application Data

(60) Provisional application No. 60/348,791, filed on Jan. 14, 2002.

(51) Int. Cl.
*H01S 3/13* (2006.01)

(52) U.S. Cl. .............. 372/29.02; 372/29.021; 372/33

(58) Field of Classification Search .......... 372/38.02, 372/29.021, 33, 29.02; 250/372, 330
See application file for complete search history.

(56) References Cited

U.S. PATENT DOCUMENTS

| | | | | |
|---|---|---|---|---|
| 4,000,397 A | * | 12/1976 | Hebert et al. | 235/462.27 |
| 6,396,062 B1 | * | 5/2002 | Buck et al. | 250/372 |
| 6,580,531 B1 | * | 6/2003 | Swanson et al. | 398/5 |
| 2002/0175287 A1 | * | 11/2002 | Busch et al. | 250/339.09 |
| 2003/0039012 A1 | * | 2/2003 | Pezzaniti et al. | 359/156 |
| 2003/0066947 A1 | * | 4/2003 | Alwan et al. | 250/206 |
| 2004/0136423 A1 | * | 7/2004 | Coldren et al. | 372/38.02 |
| 2004/0197101 A1 | * | 10/2004 | Sasser et al. | 398/117 |

FOREIGN PATENT DOCUMENTS

JP    2002-111120 A    *    4/2002

* cited by examiner

*Primary Examiner*—Armando Rodriguez
*Assistant Examiner*—Dung T. Nguyen
(74) *Attorney, Agent, or Firm*—Charles F. Reidelbach, Jr.

(57) ABSTRACT

The present invention provides for a method for configuring a laser operating system. More specifically, the system utilizes a graphical user interface (GUI) to allow an operator to interact with an embedded controller and set parameters for an optical communications transceiver. The system adjusts parameters such as laser bias and modulation currents, wavelength, qualification tests, and file management. In other words, the GUI manages configurations of a transceiver operating system. The system provides for an efficient method to design a laser transceiver and to perform and manage qualification tests. The embedded controller may contain a real time operating system that controls multiple functions in the transceiver and an optical channel. The GUI interacts with an operating system to download embedded firmware into an embedded micro controller unit (MCU). Downloading of firmware allows for multiple special programs from different sources to be integrated.

1 Claim, 6 Drawing Sheets

METHOD FOR CONFIGURING A LASER OPERATING SYSTEM

CROSS REFERENCES TO RELATED APPLICATIONS

This application is a conversion of provisional application Ser. No. 60/348,791, filed Jan. 14, 2002, entitled "Graphical User Interface for Optical Transceivers."

BACKGROUND

1. Field of the Invention

The present invention relates to a method for configuring a laser operating system. More specifically, the system utilizes a graphical user interface (GUI) to allow an operator to interact with an embedded controller and set parameters for an optical communications transceiver. An optical communications transceiver is a laser device.

2. Description of the Related Art

Prior art related to the present invention has not been located. Current known optical transceiver test systems rely on individual line commands that provide limited capability. Prior art systems rely on replacement methods and do not configure parameters and methods in an embedded micro controller (MCU) operating system for the purpose of adapting the system to various laser applications.

Prior art apparently does not use a graphical user interface (GUI) to interact with an optical transceiver system to adjust parameters. Also, prior art apparently is not optimized for providing an efficient method to design a laser transceiver and to provide a standard platform to perform and manage qualification tests. Thirdly, prior art apparently does not provide an embedded controller that controls multiple functions in a transceiver using a real time operating system. Finally, prior art apparently does not comprise a GUI that will also interact with an operating system to download embedded firmware into an embedded micro controller (MCU).

However, embedded controllers, as in the present invention, are expected to become the standard for control systems in transceivers. Product development cycles demand efficient methods to set laser parameters and other parameters in transceivers for 1) design purposes and 2) to conduct tests for research and development and for manufacturing tests. Therefore, a need exists for a method for configuring a laser operating system. Also, a need exists for an interface that utilizes a graphical user interface (GUI) to allow an operator to interact with an embedded controller and set parameters for an optical communications transceiver.

SUMMARY OF THE INVENTION

The present invention provides for numerous advantages and novel features. A graphical user interface (GUI) interacts with an optical transceiver system to adjust parameters such as laser bias and modulation currents, wavelength, qualification tests, and file management. The system provides for an efficient method to design a laser transceiver and to perform and manage qualification tests. The embedded controller may contain a real time operating system that controls multiple functions in the transceiver. The GUI will also interact with the operating system to download embedded firmware into the embedded micro controller (MCU). Downloading of firmware allows for multiple special programs from different sources to be integrated.

Numerous applications of the present invention are envisioned. Just some of them are in the medical field, in communications, in the military, and in the music field. In fact, the present invention can be useful in virtually any area where lasers are used.

BRIEF DESCRIPTION OF THE DRAWINGS

Details of the invention, and of the preferred embodiment thereof, will be further understood upon reference to the drawings wherein:

FIG. 5 illustrates a temperature sensor parameter screen (500)

DETAILED DESCRIPTION OF AN EMBODIMENT

The above-mentioned difficulties and problems of the prior art are overcome by the present invention. A plurality of exemplary screens are first described in detail. Then the overall method of operation is described.

Figure 1:
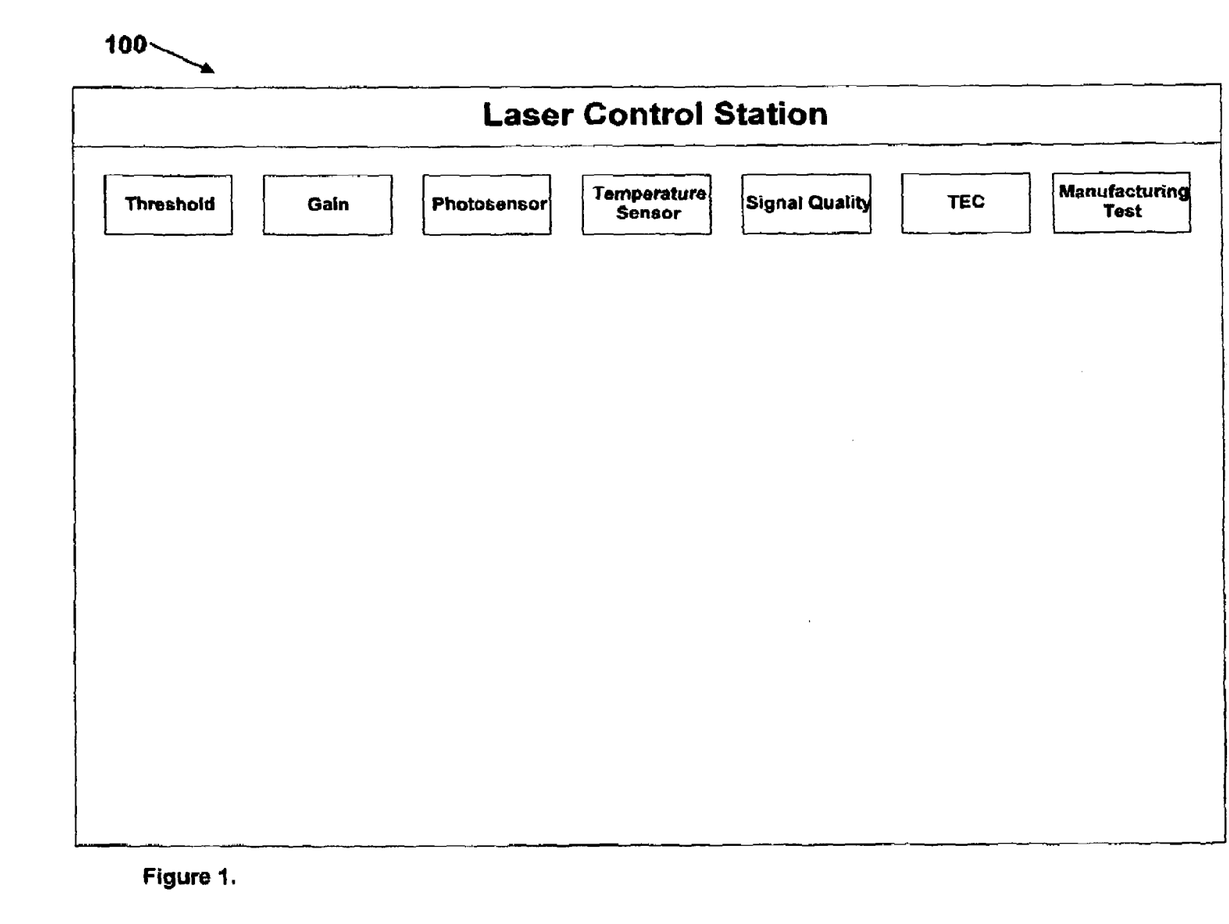
FIG. 1 illustrates an introductory screen (100) for a graphical user interface (GUI) of the present invention.

Referring to FIG. 1, an introductory screen (100) for a graphical user interface (GUI) of the present invention is illustrated. The interface may show a variety of icons and is responsive to mouse features for pointing and selecting functions. In other words, the introductory screen (100) is exemplary only. Menus for a variety of functions are available and can be recalled with the right mouse button. Sequential moves of the middle mouse button can be used to recognize additional functions. Each function allows the user to perform a parameter setting or to modify the functionality of the optical transceiver. The GUI operates under any of the operating systems available such as windows (TM Microsoft Corporation), Unix and Linux. Various windows can be cascaded. The GUI interacts with an embedded micro controller (MCU) to set internal transceiver parameters and functions. MCU memory contains two special sectors (sector X and sector Y) in order to store parameters.

Figure 2:
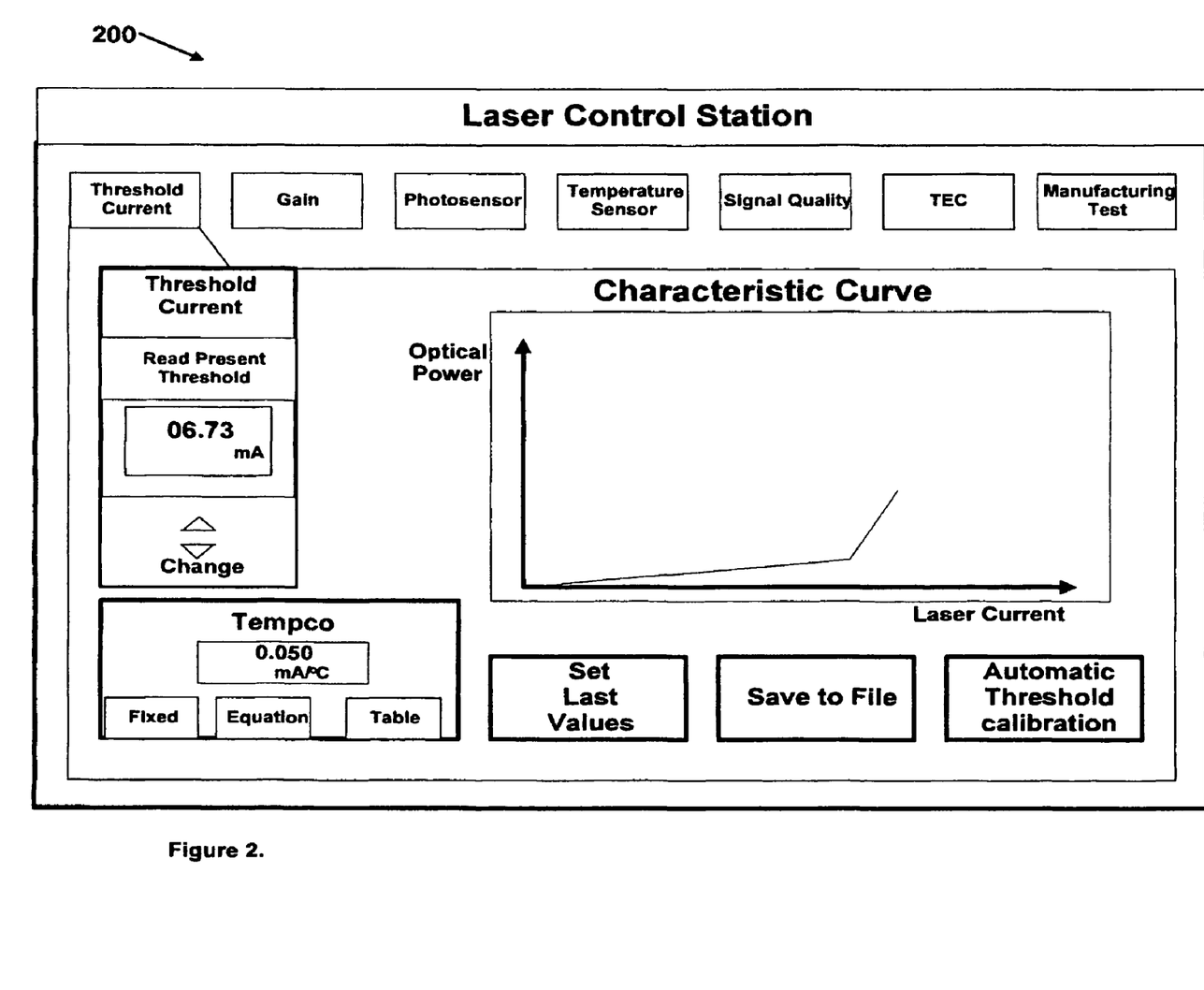
FIG. 2 illustrates a laser threshold parameter screen (200)

Referring to FIG. 2, a screen (200) for a laser threshold parameter of the present invention is illustrated. In all cases, changes in the GUI result in downloading parameters to the MCU and downloading changes in operational methods of the control system. The laser threshold parameter screen (200) is exemplary only. The laser threshold functions include the following:

Reading the present threshold,

Asking an embedded micro controller unit (MCU) for the present value of the laser threshold used, and Placing the information on display.

The change function forces an increase or a decrease of the threshold with the aid of the "buttons", or function icons. The change function changes a blinking point on a characteristic curve as a change is made. Then the result of the change is placed on display.

The Tempo function allows the entry of temperature coefficients. Within the tempo function, a fixed icon allows a number to be typed on the display.

An equation icon provides an entry table for $a_0$, $a_1$, $a_2$, $a_3$, $a_4$, polynomial parameters. A table icon provides an entry table for threshold and tempo vs. Temperature for every 1 degree C. Results are put on display.

The automatic threshold calibration function queries a user to connect optical power meter and ambient temperature meter and automatically sets the threshold. The threshold given a margin of n counts for noise margin. Results are put on display.

The sets last value function sets the laser system to the last value obtained either from automatic calibration or from manually changing value by overriding sector X Threshold information with sector Y Threshold information. Before overriding, the program asks for confirmation of override command.

The save to file function saves to a file the current values of sector Y Threshold information and an image of the screen The characteristic curve function assumes the curve starts at zero, connects with line to threshold value prior to adding noise margin (plots region of spontaneous emission). The curve connects to stimulated emission region to the location of the threshold with noise margin. A data point on the graph is marked with a circle and blinking.

Instead of assuming the curve starts at zero, the characteristic curve function can plot the actual data from the process of setting the threshold.

Figure 3:
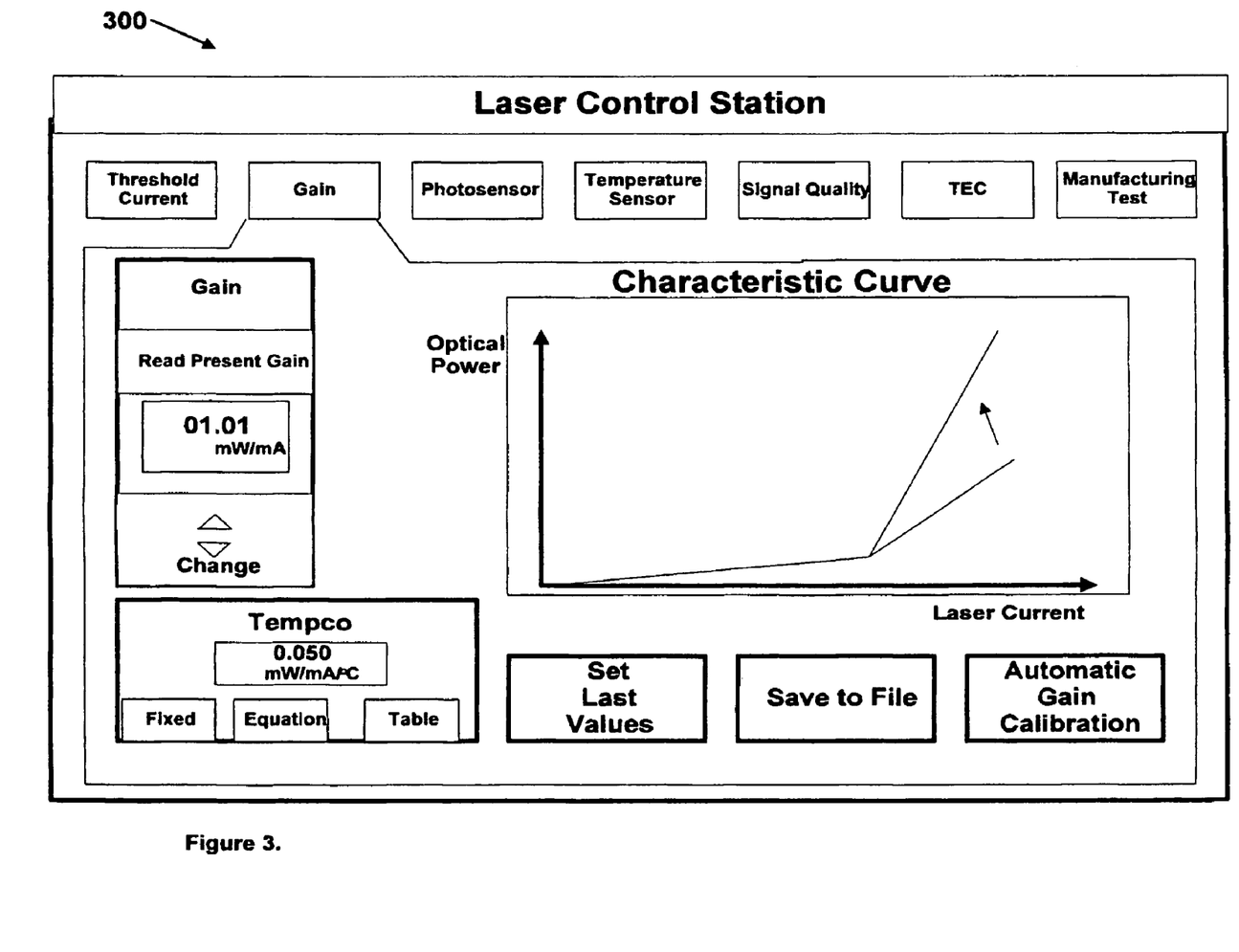
FIG. 3 illustrates a laser gain parameter screen (300)

Referring to FIG. 3, a screen (300) for a laser gain parameter of the present invention is illustrated. The laser gain parameter screen (300) is exemplary only. The gain adjustments function may include driver gain and slope efficiency of a laser. The read present gain function asks a MCU for the present value of maximum gain used, then places information on display. The change function forces an increase or a decrease of the gain with the aid of the buttons, or icons. The change function rotates the characteristic curve and shows a new location for maximum gain point as a change is made, then places results on display.

The Tempco function allows the entry of temperature coefficients. Within the Tempco function, a fixed icon allows a number to be typed on the display.

An equation icon provides an entry table for $a_0$, $a_1$, $a_2$, $a_3$, $a_4$, polynomial parameters (phase 2). A table icon provides an entry table for gain and Tempco vs. Temperature for every 1 degree C. Results are put on display.

The automatic gain calibration function queries a user to connect optical power meter and ambient temperature meter and automatically sets the gain. Gain is given a margin of n counts for noise margin. Default can be set. The results are placed on display.

The set last value function sets the laser system to the last value obtained either from automatic calibration or from manually changing value by overriding sector X gain information with sector Y gain information.

The save to file function saves to a file the current values of sector Y gain information and an image of the screen. Before overriding, the program asks for confirmation of override command.

The characteristic curve function plots curves utilizing a working threshold curve. The curve connects a bias point (threshold with noise margin) to a point of Maximum Operating Power. A data point of maximum operating power on the graph is marked with a circle and blinking. Instead of utilizing a working threshold curve, the characteristic curve function can plot several actual data points obtained from the process of setting the gain.

Figure 4:
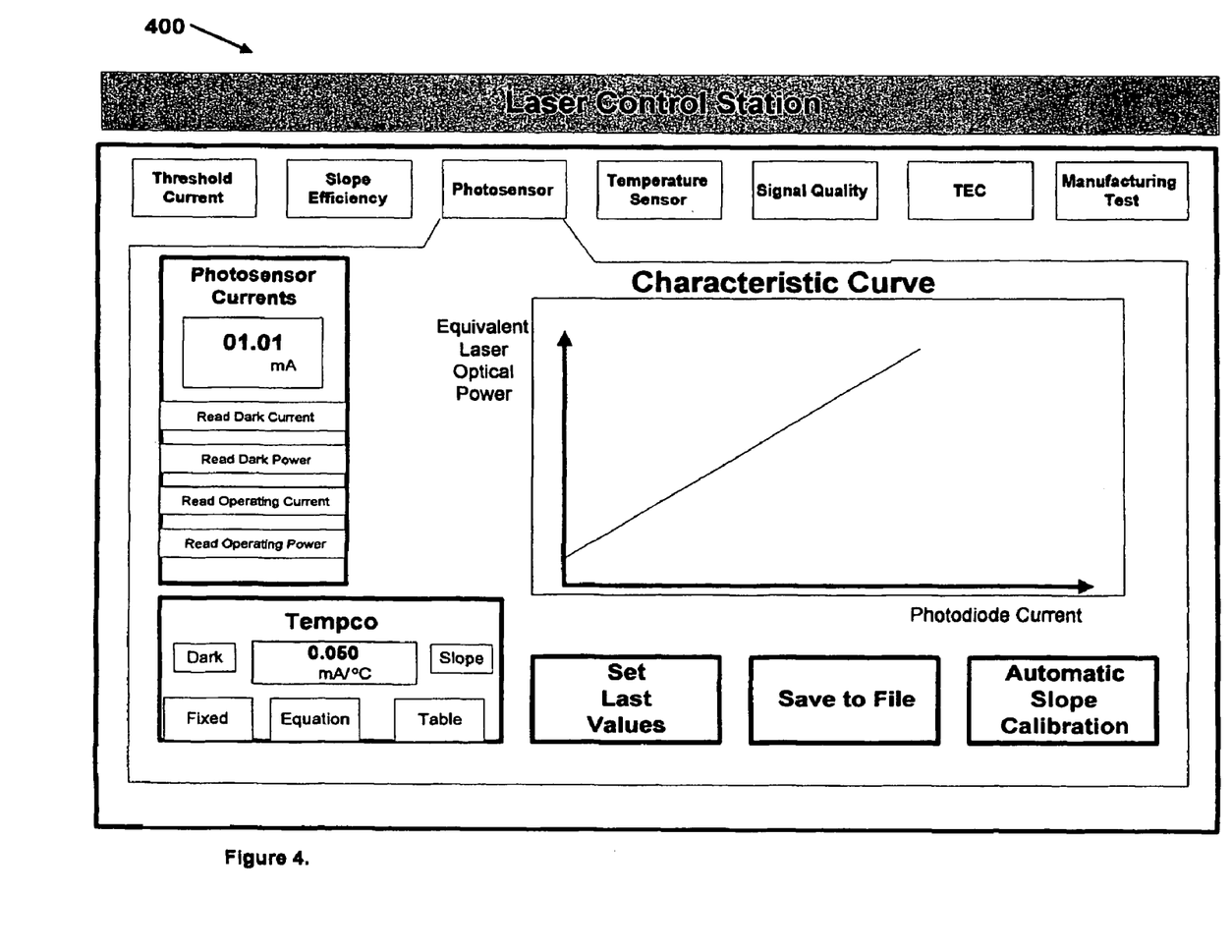
FIG. 4 illustrates a photosensor parameter screen (400)

Referring to FIG. 4, a screen (400) for a photosensor parameter of the present invention is illustrated. The photosensor parameter screen (400) is exemplary only. The photosensor reads one of the following: dark current, power offset, operating current, and operating power. The results are placed on display.

The Tempco function allows the entry of temperature coefficients for both offset and slope. Within the Tempco function, a fixed icon allows a number to be typed on the display. An equation icon provides an entry table for $a_0$, $a_1$, $a_2$, $a_3$, $a_4$, polynomial parameters. A table icon provides an entry table for Dark (slope) current vs. Temperature for every 1 degree C. The corresponding Dark Power (or slope of characteristic) is calculated and the results are put on display depending on whether Dark Power or slope button for slope of characteristic is pushed.

The set last value function sets the laser system to the last value obtained either from automatic calibration or from manually changing values by overriding sector X photosensor information with sector Y photosensor information.

The save to file function saves to a file the current values of sector Y photosensor information and an image of the screen. Before overriding, the program asks for confirmation of override command.

The characteristic curve function plots curves utilizing a working photosensor curve. The curve connects a Dark Power point to a point of Maximum Operating Power. A data point of currently sensed operating power on the graph is marked with a circle and blinking. Instead of utilizing a working photosensor curve, the characteristic curve function can plot several actual data points obtained from the process of calibrating the sensor.

Referring to FIG. 5, a screen (500) for a temperature sensor parameter of the present invention is illustrated. The temperature sensor parameter screen (500) is exemplary only.

The temperature sensor function reads current temperature. The results are placed on display. The change function forces an increase or a decrease of the offset or slope of the temperature curve with the aid of the buttons, or icons. The characteristic curve shows movement as changes are made, then places results on display.

The Tempco function allows the entry of temperature coefficients for the temperature curve. Within the Tempco function, a fixed icon allows a number to be typed on the display. An equation icon provides an entry table for $a_0$, $a_1$, $a_2$, $a_3$, $a_4$, polynomial parameters. A table icon provides an entry table for gain and Tempco vs. Temperature for every 1 degree C. The corresponding temperature is then calculated. Results are put on display depending on the button, or icon, pushed.

The set last value function sets the temperature values for present temperature and Tempcos to the last value obtained either from automatic calibration or from manually changing values by overriding sector X temperature information with sector Y temperature information.

The save to file function saves to a file the current values of sector Y temperature information and an image of the screen. Before overriding, the program asks for confirmation of override command.

The characteristic curve function plots curves utilizing a working temperature curve. The curve connects a zero degrees c point to 70 degrees C. point. A data point of present temperature on the graph is marked with a circle and blinking. Instead of utilizing a working temperature curve, the characteristic curve function can plot several actual data points obtained from the process of calibrating the sensor.

Figure 6:
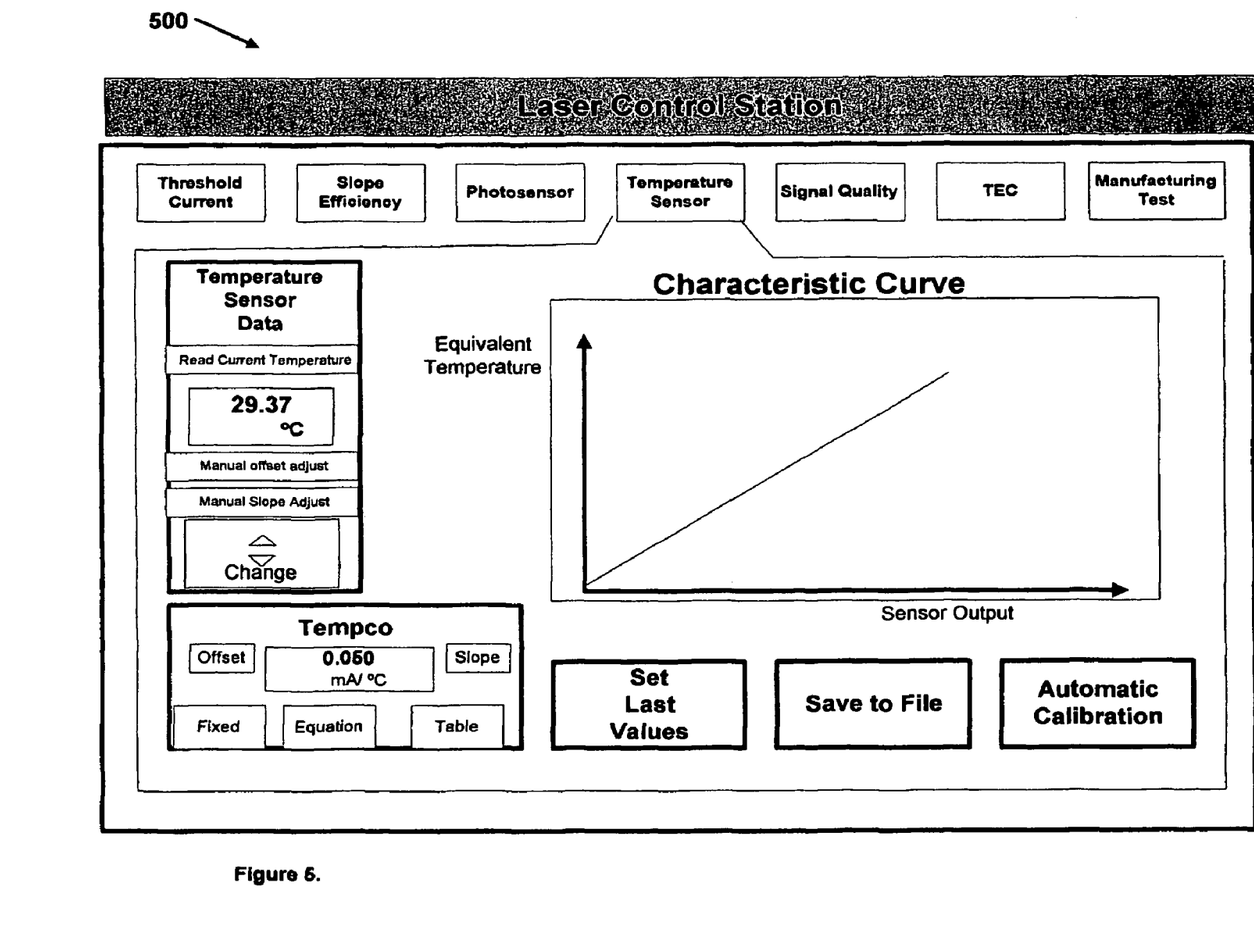
FIG. 6 illustrates a signal quality parameter screen (600).

Referring to FIG. 6, a screen (600) for a signal quality parameter of the present invention is illustrated. The signal quality parameter screen (600) is exemplary only.

The signal quality and reliability function allows the measurement of peak-to-peak noise of the laser output. The function instructs the operator to connect appropriate equipment and sends commands to the MCU to set the laser transmitter for noise measurements.

An extinction ratio is measured with the use of either internal sensor or external meter. The interface may instruct the MCU to adjust laser drive to optimize extinction ratio.

A signal quality function also sets the optical channel in loop test. This test transmits data from the local transceiver to a remote transceiver. The remote transceiver returns the received information to the first transceiver and a determination of the channel Bit Error Rate is made.

A remote wavelength calibration function communicates with a remote controller for the purpose of calibrating the wavelength in wavelength division multiplexing (WDM, coarse WDM dense WDM-DWDM systems). The process is the following:

a. Local transceiver sends signal to remote receiver and host (generally at optical network sub-station).
b. Remote receiver senses signal and sends it to precision wavelength measurement instrument. Remote host determines if wavelength setting meets specifications.
c. If incorrect settings are found, remote host sends back on receiver channel a command with the magnitude of the wavelength adjustment needed.
d. Local transceiver returns information with the command to the local MCU.
e. Local MCU uses tuning system to tune the wavelength of the laser.
f. Process is repeated until the wavelength setting is optimized.
g. Results and graphs are displayed in the GUI.

In a manner similar to the above description, other optical channel parameters, such as polarization, may be controlled, adjusted remotely and results displayed in the GUI.

Other GUI functions include the adjustment and managing of operations for thermoelectric cooler (TEC)/heater units.

The GUI also facilitates the execution of manufacturing tests for a transceiver production line.

Overall Method of Operation

The present invention provides a method for configuring a laser operating system. More specifically, the method of operation of the present invention allows an operator to interact through a graphical user interface (GUI) with an embedded controller and set parameters for an optical communications transceiver. Even more specifically, the method comprises the following steps.

First, the GUI manages (700) a plurality of configurations of a laser operating system. Note that a laser operating system may also be termed a transceiver operating system. Second, a plurality of laser parameters are loaded (710) into an embedded transceiver controller. Thirdly, the GUI interacts (720) in real time with the laser operating system. Then a plurality of laser parameters are set (730) interactively using the graphical user interface (GUI). Optionally, the GUI can adjust (800) the functionality of a laser operating system and of an optical transceiver (also termed a laser). Also, optionally, the GUI can set (900) performance tests for an optical transceiver. Optionally, the GUI can also download (1000) a plurality of application programs in firmware to a micro controller unit (MCU). Alternatively, the GUI can interact (1100) with a remote host through a local transceiver.

Consequently, while the foregoing description has described the principle and operation of the present invention in accordance with the provisions of the patent statutes, it should be understood that the invention may be practiced otherwise as illustrated and described above and that various changes in the size, shape, and materials, as well as on the details of the illustrated method of operation may be made, within the scope of the appended claims without departing from the spirit and scope of the invention.

What is claimed is:

1. A method for configuring an optical transceiver system including a laser device comprising:

configuring a real time operating system embedded in the optical transceiver; and, interacting with the optical transceiver through the embedded operating system by interactively setting and storing a plurality of optical transceiver operational parameters using an external graphical user interface wherein the step of setting an operational parameter comprises performing a wavelength calibration function and wherein the step of performing a wavelength calibration function comprises communicating with a remote controller for the purpose of calibrating the wavelength in an optical channel using wavelength division multiplexing and wherein the step of communicating with a remote controller comprises sending a signal from a local transceiver to a remote host, receiving the signal at the remote host, generating a wavelength measurement and determining if the local wavelength setting meets specifications at the remote host, sending a command from the remote host to the local transceiver specifying the magnitude of a wavelength adjustment if needed, locally tuning the wavelength of the optical transceiver, and displaying results and graphs with the graphical user interface.

* * * * *

UNITED STATES PATENT AND TRADEMARK OFFICE
CERTIFICATE OF CORRECTION

PATENT NO. : 7,154,924 B2 Page 1 of 1
APPLICATION NO. : 10/512931
DATED : December 26, 2006
INVENTOR(S) : Jorge Sanchez It is certified that error appears in the above-identified patent and that said Letters Patent is hereby corrected as shown below:

On the Title Page:

In the Related U.S. Application Data, add

--This application is a National Stage entry of PCT application No. PCT/US03/00848, filed on Jan. 13, 2003, which in turn is a utility conversion of provisional application Ser No. 60/348,791, filed Jan. 14, 2002.--

On the specification of the patent:

Column 1, in the CROSS REFERENCE TO RELATED APPLICATIONS Data, remove

"This application is a conversion of provisional application Ser No. 60/348,791, filed Jan. 14, 2002, entitled "Graphical User Interface for Optical Transceivers.""

and replace with

--This application is a National Stage entry of PCT application No. PCT/US03/00848, entitled "Method for Configuring a Laser Operating System", filed on Jan. 13, 2003, which in turn is a utility conversion of provisional application Ser No. 60/348,791, filed Jan. 14, 2002, entitled "Graphical User Interface for Optical Transceivers."--

Signed and Sealed this

Fourteenth Day of October, 2008

JON W. DUDAS
*Director of the United States Patent and Trademark Office*